United States Patent
Cheng et al.

(10) Patent No.: US 6,925,099 B2
(45) Date of Patent: Aug. 2, 2005

(54) CONTROL OF VCSEL EMISSION FOR BETTER HIGH-SPEED PERFORMANCE

(75) Inventors: Hengju Cheng, Mountain View, CA (US); Anchun Tien, San Jose, CA (US)

(73) Assignee: Stratos International, Inc., Chicago, IL (US)

( * ) Notice: Subject to any disclaimer, the term of this patent is extended or adjusted under 35 U.S.C. 154(b) by 0 days.

(21) Appl. No.: 10/286,646

(22) Filed: Nov. 1, 2002

(65) Prior Publication Data

US 2003/0081296 A1 May 1, 2003

Related U.S. Application Data

(60) Provisional application No. 60/344,449, filed on Nov. 1, 2001.

(51) Int. Cl.[7] .............................................. H01S 3/10
(52) U.S. Cl. .............................. 372/26; 372/6; 372/43; 385/31; 385/33
(58) Field of Search ........................... 372/26, 6, 43, 372/44, 45, 46, 50, 109; 385/31, 33

(56) References Cited

U.S. PATENT DOCUMENTS

| | | | |
|---|---|---|---|
| 470,553 A | 3/1892 | Dozier | |
| 919,745 A | 4/1909 | McCraw | |
| 1,089,939 A | 3/1914 | Maxwell | |
| 1,211,853 A | 1/1917 | Huggins | |
| 1,338,776 A | 5/1920 | Jennings | |
| 2,911,024 A | 11/1959 | Miceli | |
| 2,988,125 A | 6/1961 | Reynolds | |
| 3,335,775 A | 8/1967 | Adams | |
| 4,542,826 A | 9/1985 | Adams | |
| 4,880,315 A | 11/1989 | Berry et al. | |
| 5,350,045 A | 9/1994 | Robertson | |
| 5,771,254 A * | 6/1998 | Baldwin et al. | 372/31 |
| 5,815,623 A * | 9/1998 | Gilliland et al. | 385/93 |
| 5,835,514 A * | 11/1998 | Yuen et al. | 372/36 |
| 5,867,620 A | 2/1999 | Bunin et al. | 285/53 |
| 5,873,504 A | 2/1999 | Farmer | |
| 5,961,216 A | 10/1999 | Quinn | |
| 6,186,201 B1 | 2/2001 | Salz | |
| 6,243,508 B1 * | 6/2001 | Jewell et al. | 385/14 |
| 6,298,993 B1 | 10/2001 | Kalozdi | |
| 6,454,470 B1 * | 9/2002 | Dwarkin et al. | 385/93 |
| 6,488,419 B2 * | 12/2002 | Kato et al. | 385/93 |
| 6,510,265 B1 * | 1/2003 | Giaretta et al. | 385/38 |
| 6,530,697 B1 * | 3/2003 | Johnson et al. | 385/88 |
| 2002/0056852 A1 * | 5/2002 | Scott et al. | 257/184 |
| 2002/0094175 A1 * | 7/2002 | Oskarsson | 385/88 |
| 2002/0197038 A1 * | 12/2002 | Abbott et al. | 385/124 |
| 2003/0039024 A1 * | 2/2003 | Clayton et al. | 359/326 |
| 2003/0072525 A1 * | 4/2003 | Sjodin et al. | 385/31 |

OTHER PUBLICATIONS

U.S. Appl. No. 60/344,449, filed Nov. 1, 2001.

* cited by examiner

*Primary Examiner*—Minsun Oh Harvey
*Assistant Examiner*—Dung Michael T. Nguyen
(74) *Attorney, Agent, or Firm*—Karl D. Kovach

(57) ABSTRACT

A device includes a VCSEL, an optical fiber, and a lens. The VCSEL generates optical light signals having a spatial emission pattern based around an axis of emission. Light signals emitted from the VCSEL substantially along or near the axis of emission are known as high speed modulation patterns. Light signals emitted at angles away from the axis of emission are known as slow speed modulation patterns. Slow speed modulation patterns become slower as the angle between the emitted light signals and the axis of emission increase. The lens is selectively positioned between the VCSEL and the optical fiber for focusing the high speed modulation patterns of the light signals on the optical fiber, and the lens substantially does not focus the slow speed modulation patterns of the light signals on the optical fiber.

3 Claims, 2 Drawing Sheets

CONTROL OF VCSEL EMISSION FOR BETTER HIGH-SPEED PERFORMANCE

This non-provisional application claims the priority of the earlier filed U.S. Provisional Patent Application Ser. No. 60/344,449, filed Nov. 1, 2001. U.S. Provisional Patent Application Ser. No. 60/344,449 is hereby incorporated herein by reference.

BACKGROUND OF THE INVENTION

1. Field of the Invention

The present invention pertains to the field of optoelectronics. The invention more particularly concerns a device which selectively controls the emission pattern of a vertical cavity surface emitting laser (VCSEL).

2. Discussion of the Background

VCSELs are key devices used in transceiver subassemblies for high-speed optical communication. The LED-like structure makes the VCSEL a better light source in optical transceiver modules than the edge emitting laser diode. The advantages of a VCSEL arise from its easy testing, easy packaging, and low power consumption. However, the emission pattern dependent high-speed optical waveforms produced by VCSELs can cause significant problems at high data transmission rates.

It has been determined that the modulation speed of light out of a VCSEL is a spatial function of its emission angle. FIG. 1 is a side view of a VCSEL 1. An axis of emission 5 is oriented normal or perpendicular to a surface plane 2 of the VCSEL 1. The surface plane 2 of the VCSEL 1 runs into and out of the paper of FIG. 1. In general, the larger the angle $\theta$ from perpendicular, the slower the modulation speed of the emitted light from the VCSEL 1. FIG. 1 shows that a fast pattern of light 3 is emitted from the VCSEL 1 along the axis of emission 5 and that a slow pattern of light 4 is emitted from the VCSEL 1 at the angle $\theta$ away from the axis of emission 5. The speed dependent emission pattern is symmetrical in all directions perpendicular to the axis of emission 5.

In low speed applications, such as in Gigabit Ethernet applications, where only one Gigabits per second of modulation is needed, the presence of fast and slow patterns of light is not an issue, since the slower light is fast enough to catch up to the electrical modulation. However, when pushing to higher speeds, such as two and one-half Gigabits per second and beyond, the light having the slow modulation has caused significant degradation in the eye-diagram quality. The resulting jitter and eye-closure of the performance of the VCSEL-based device in such applications has greatly reduced the achievable optical link distance.

Thus, there is a need to either eliminate the slow light pattern 4 or to separate the slow light pattern 4 from the fast light pattern 3 so as to increase the achievable optical link distance of VCSEL-based devices at high modulation speeds.

SUMMARY OF THE INVENTION

Therefore, it is an object of the invention to provide a device which functionally eliminates the slow light pattern.

It is another object of the invention to provide a device which separates the slow light pattern from the fast light pattern.

It is still yet another object of the invention to provide a device which provides a jitter free and open-eye eye pattern resulting in an increase in the optical link distance at high modulation speeds.

In one form of the invention, the device includes a VCSEL, an optical fiber, a lens, and an element having an aperture. The VCSEL generates optical light signals having a spatial emission pattern based around an axis of emission. Light signals emitted from the VCSEL substantially along or near the axis of emission are known as high speed modulation patterns. Light signals emitted at angles away from the axis of emission are known as slow speed modulation patterns. Slow speed modulation patterns become slower as the angle between the emitted light signals and the axis of emission increase. The aperture of the element having the aperture is sized so as to allow the high speed modulation patterns of the light signals to pass therethrough and the aperture is also sized so as to substantially prevent the slow speed modulation patterns of the light signals from passing therethrough. The lens focuses the high speed modulation patterns of the light signals on the optical fiber. The lens is positioned between the VCSEL and the optical fiber. The lens is positioned in the aperture of the element. The lens is separated from the optical fiber by a gap. The element is likewise also separated from the optical fiber by the gap. The optical fiber includes a core surrounded by cladding, and the high speed modulation patterns of the light signal are focused on the core. Thus, the lens, and the element do not contact the optical fiber. Furthermore, the VCSEL does not contact the element. The VCSEL is modulated at a speed substantially equal to two and one-half Gigabits per second.

In still another form of the invention, the device includes a VCSEL, an optical fiber, an element having an aperture, and a lens. The VCSEL generates optical light signals having a spatial emission pattern based around an axis of emission. Light signals emitted from the VCSEL substantially along or near the axis of emission are known as high speed modulation patterns. Light signals emitted at angles away from the axis of emission are known as slow speed modulation patterns. Slow speed modulation patterns become slower as the angle between the emitted light signals and the axis of emission increase. The lens is positioned between the VCSEL and the optical fiber. The aperture of the element having the aperture is sized so as to allow the high speed modulation patterns of the light signals to pass therethrough and the aperture is also sized so as to substantially prevent the slow speed modulation patterns of the light signals from passing therethrough. The lens focuses the high speed modulation patterns of the light signals on the optical fiber. The lens is positioned in the aperture of the element. The lens is separated from the optical fiber by a gap. The element is likewise also separated from the optical fiber by the gap. The optical fiber includes a core surrounded by cladding, and the high speed modulation patterns of the light signal are focused on the core. Thus, the lens, and the element do not contact the optical fiber. Furthermore, the VCSEL does not contact the element. The VCSEL is modulated at speeds above two and one-half Gigabits per second.

Thus, the present invention provides a device which separates the slow light pattern from the fast light pattern and is compact.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PRESENTLY PREFERRED EMBODIMENTS

Figure 1:
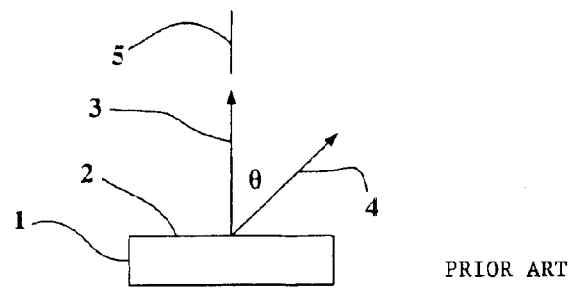
FIG. 1 is a side view of a vertical cavity surface emitting laser (VCSEL)
Figure 2:
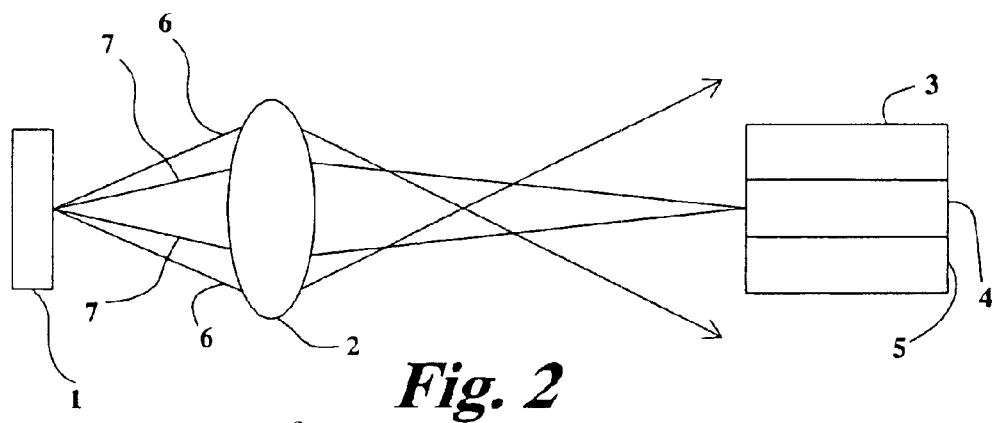
FIG. 2 is a side view of a device incorporating elements of a first embodiment of the invention.

Referring now to the drawings, wherein like reference numerals designate identical or corresponding parts throughout the several views, and more particularly to FIG. 2 thereof, is a device incorporating elements of a first embodiment of the invention.

FIG. 2 is a side view of the device. The optoelectronic device includes a VCSEL 1, a lens 2, and an optical fiber 3. The optical fiber 3 includes a core 4 surrounded by cladding 5. The lens 2 is formed so as to discriminate between the high speed modulation patterns or the fast light pattern 7 emitted along, or only small angles away from, the axis of emission and slow speed modulation patterns or the slow light pattern 6 emitted at large angles away from the axis of emission. The lines between the VCSEL 1, the lens 2, and the optical fiber 3 indicate the direction of travel of the light emitted by the VCSEL 1. The lens 2 causes the slow light pattern or large angle light 6 to be out of focus and thus miss the core or aperture 4 of the optical fiber 3. However, the fast light pattern or low angle light 7 is focused into the core 4 of the optical fiber 3 as shown in FIG. 2. Therefore, the device selectively couples the fast or high speed light 7 into the optical fiber 3 while the slow speed light 6 is rejected.

Figure 3:
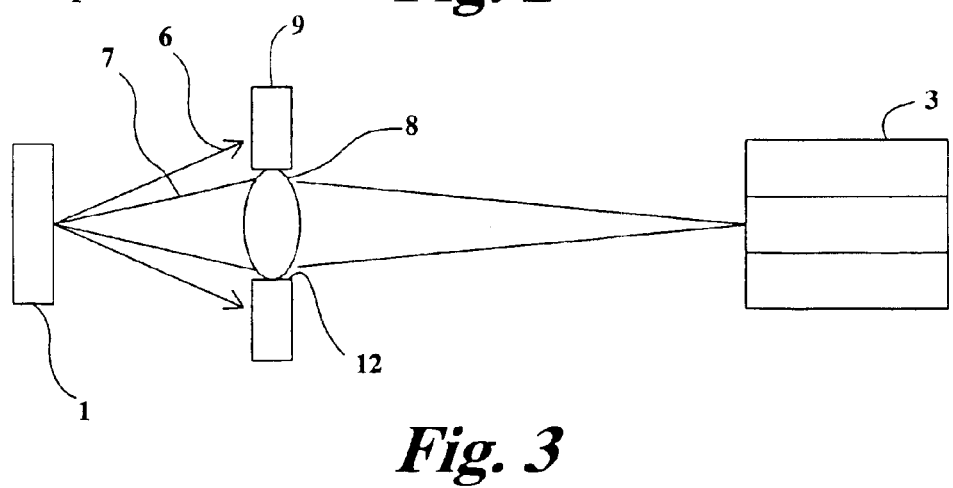
FIG. 3 is a side view of a device incorporating elements of a second embodiment of the invention.

FIG. 3 is a side view of a device incorporating elements of a second embodiment of the invention. The optoelectronic device includes a VCSEL 1, a lens 8, an element 9 having an aperture 12, and an optical fiber 3. The optical fiber 3 includes a core surrounded by cladding. The element 9 having the aperture 12 is sized so that the slow light pattern or high or large angle light 6 is incident on the element 9 and is not able to pass through the aperture 12 of the element 9. The element 9 having the aperture 12 is also sized so as to allow the fast light pattern 7 to pass through the aperture 12. The lens 8 is sized so that the fast light pattern 7 is focused on the optical fiber 3. The lens 8 need not be located adjacent to the aperture 12 of the element 9. The lens 8 and the element 9 having the aperture 12 can be located away from each other so long as the two elements prevent the coupling of the low angle light 7 with the high angle light 6. Thus, the fast light pattern 7 is selectively coupled with the optical fiber 3. The side view of the device as shown FIG. 3 is taken from a perspective that is generally perpendicular to a direction of propagation of the fast light pattern 7 which is substantially along the axis of emission of the VCSEL 1. As shown in FIG. 3, the lens 8, when viewed from the side, has a shape that is substantially similar to a shape of an ellipse.

In one form of the second embodiment of the invention, the core 4 of the optical fiber 3 acts as the aperture 12 of the element 9. No optics are needed in such a device. The optical fiber is positioned relative to the VCSEL so that the optical fiber itself acts as an aperture where the fast light pattern 7 enters the optical fiber 3 and the slow light pattern 6 is not incident on the optical fiber 3.

Figure 4:
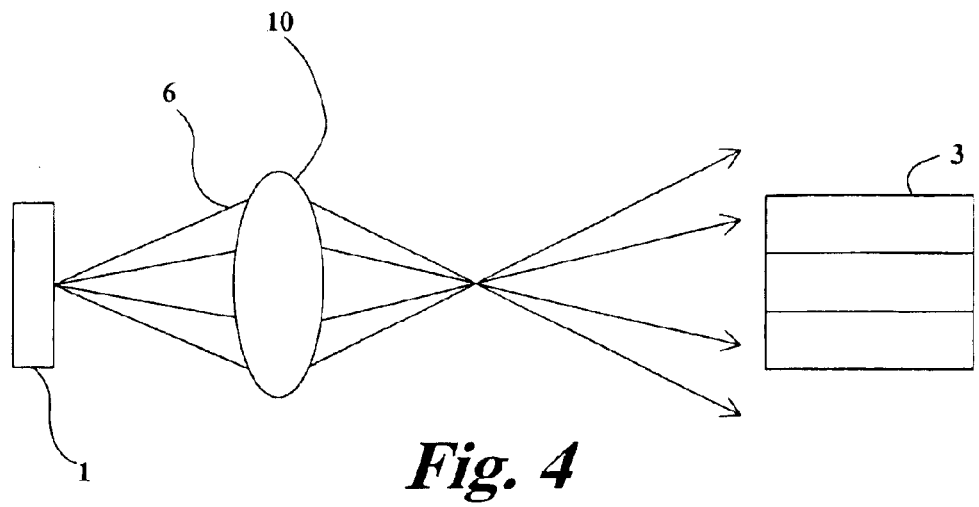
FIG. 4 is a side view of a device incorporating elements of a third embodiment of the invention.

FIG. 4 is a side view of a device incorporating elements of a third embodiment of the invention. The optoelectronic device includes a VCSEL 1, a lens 10, and an optical fiber 3. The optical fiber 3 includes a core surrounded by cladding. The lens 10 has a relatively large angular magnification. The larger angular magnification of lens 10 couples less high-emission angle light 6 into the optical fiber 3 as compared to a similar lens having a smaller angular magnification. As shown in FIG. 4, the large angle light or slow light pattern 6 is not coupled with the optical fiber 3.

Figure 5:
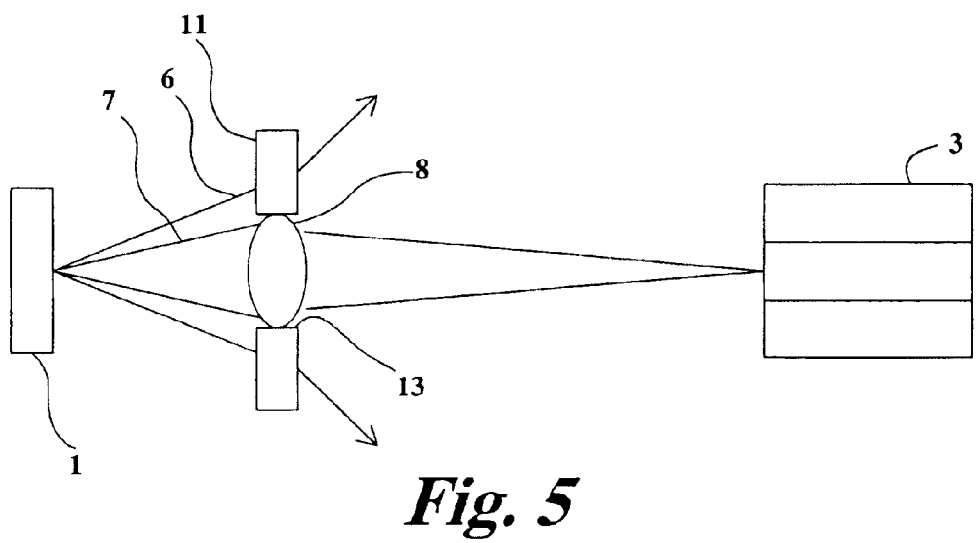
FIG. 5 is a side view of a device incorporating elements of a fourth embodiment of the invention.

FIG. 5 is a side view of a device incorporating elements of a fourth embodiment of the invention. The optoelectronic device includes a VCSEL 1, a lens 8, an element 11 having an aperture 13, and an optical fiber 3. The optical fiber includes a core surrounded by cladding. The element 11 having the aperture 13 is sized so that the slow light pattern or high or large angle light 6 is incident on the element 11. The element 11 is transparent and as such does not block the light, however, the element 11 does disperse the slow light pattern 6 in a direction other than into the optical fiber 3. The element 11 having the aperture 13 is also sized so as to allow the fast light pattern 7 to pass through the aperture 13. The lens 8 is sized so that the fast light pattern 7 is focused on the optical fiber 3. The lens 8 need not be located adjacent to the aperture 13 of the element 11. The lens 8 and the element 11 having the aperture 13 can be located away from each other so long as the two elements prevent the coupling of the low angle light 7 with the high angle light 6. Thus, the fast light pattern 7 is selectively coupled with the optical fiber 3. The element 11 having the aperture 13 is also known as a soft aperture. The side view of the device as shown in FIG. 5 is taken from a perspective that is generally perpendicular to a direction of propagation of the fast light pattern 7. As shown in FIG. 5, the lens 8, when viewed from the side, has a shape that is substantially similar to a shape of an ellipse.

Therefore, by limiting the emission pattern of the VCSEL, the high-speed optical waveform can be optimized. All of the above-mentioned embodiments provide such a result. These designs provide for VCSEL-based optoelectronic devices capable of operating at high modulation speeds while maintaining a clean eye-diagram and having low jitter. Such VCSEL-based optoelectronic devices provide for greatly extended optical link distances.

Obviously, numerous modifications and variations of the present invention are possible in light of the above teachings. It is therefore to be understood that within the scope of the appended claims, the invention may be practiced otherwise than as specifically described herein.

What is claimed is:

1. An optoelectronic device consisting of:

only one vertical cavity surface emitting laser for generating optical light signals having a spatial emission pattern based around an axis of emission, light signals emitted from the only one vertical cavity surface emitting laser substantially along or near the axis of emission are known as high speed modulation patterns, and light signals emitted at angles away from the axis of emission are known as slow speed modulation patterns, and wherein the slow speed modulation patterns of the light signals become slower as the angle between the emitted light signals and the axis of emission is increased, and wherein the only one vertical cavity surface emitting laser operates at speeds above two and one-half Gigabits per second;

only one element having only one aperture, the only one aperture sized so as to allow the high speed modulation patterns of the light signals to pass therethrough, and the only one aperture sized so as to substantially prevent the slow speed modulation patterns of the light signals from passing therethrough;

only one optical fiber; and only one lens positioned between the only one vertical cavity surface emitting laser and the only one optical fiber, the only one lens positioned in the only one aperture of the only one element, and wherein the only one lens focuses the high speed modulation patterns of the light signals on the only one optical fiber, and wherein the only one lens, when viewed from a perspective substantially perpendicular to the axis of emission of the only one vertical cavity surface emitting laser, has a shape of an ellipse, and wherein the only one lens is separated from the only one optical fiber by a gap, and wherein the only one element is separated from the only one optical fiber by the gap, and wherein the only one element is positioned between the only one vertical cavity surface emitting laser and the only one optical fiber, and wherein the only one optical fiber includes a core surrounded by cladding, and wherein the high speed modulation patterns of the light signals are focused on the core.

2. An optoelectronic device according to claim 1 wherein the only one element is substantially opaque to slow speed modulation patterns of the light signals.

3. An optoelectronic device according to claim 1 wherein the only one element is made of a material that is transparent and diffuses slow speed modulation patterns of the light signals away from the only one optical fiber.

* * * * *